United States Patent
Navarro et al.

(10) Patent No.: US 9,890,241 B2
(45) Date of Patent: Feb. 13, 2018

(54) PROCESS FOR SYNTHESIZING PEDOT-ELECTROLYTIC (CO)POLYMER

(71) Applicants: ARKEMA FRANCE, Colombes (FR); CENTRE NATIONAL DE LA RECHERCHE SCIENTIFIQUE (CNRS), Paris (FR); UNIVERSITE DE BORDEAUX, Bordeaux (FR); INSTITUT POLYTECHNIQUE DE BORDEAUX, Talence (FR)

(72) Inventors: Christophe Navarro, Bayonne (FR); Usein Ismailov, Aix en Provence (FR); Muhammad Mumtaz, Bordeaux (FR); Eric Cloutet, Saint Caprais de Bordeaux (FR); Cyril Brochon, Merignac (FR); Georges Hadziioannou, Leognan (FR)

(73) Assignees: Arkema France, Colombes (FR); Centre National De La Recherche Scientifique, Paris (FR); Universite De Bordeaux, Bordeaux (FR); Institut Polytechnique De Bordeaux, Talence (FR)

( * ) Notice: Subject to any disclaimer, the term of this patent is extended or adjusted under 35 U.S.C. 154(b) by 81 days.

(21) Appl. No.: 15/032,882

(22) PCT Filed: Oct. 29, 2014

(86) PCT No.: PCT/FR2014/052749
§ 371 (c)(1),
(2) Date: Apr. 28, 2016

(87) PCT Pub. No.: WO2015/063415
PCT Pub. Date: May 7, 2015

(65) Prior Publication Data
US 2016/0257780 A1  Sep. 8, 2016

(30) Foreign Application Priority Data
Oct. 31, 2013  (FR) ..................................... 13 60681

(51) Int. Cl.
*C08G 61/12* (2006.01)
*C08L 65/00* (2006.01)
*H01L 51/00* (2006.01)
*H01L 51/44* (2006.01)

(52) U.S. Cl.
CPC ............ *C08G 61/126* (2013.01); *C08L 65/00* (2013.01); *H01L 51/0037* (2013.01); *H01L 51/0043* (2013.01); *H01L 51/0048* (2013.01); *H01L 51/444* (2013.01); *C08G 2261/12* (2013.01); *C08G 2261/1424* (2013.01); *C08G 2261/3223* (2013.01); *C08G 2261/43* (2013.01); *C08G 2261/51* (2013.01); *C08G 2261/794* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 2006/0047030 A1 | 3/2006 | Yoshida | |
| 2008/0105854 A1 | 5/2008 | Huh | |
| 2012/0138913 A1 | 6/2012 | Alsayed | |
| 2014/0084220 A1* | 3/2014 | Inagaki | H01L 51/0036 252/511 |
| 2014/0211374 A1* | 7/2014 | Sugihara | C08L 65/00 361/527 |
| 2015/0060737 A1 | 3/2015 | Navarro | |

FOREIGN PATENT DOCUMENTS

| | | |
|---|---|---|
| DE | 202012007001 | 11/2012 |
| WO | 2013150242 | 10/2013 |

OTHER PUBLICATIONS

International Search Report and Written Opinion for International Application No. PCT/FR2014/052749, dated Apr. 23, 2015, 9 pages.

* cited by examiner

*Primary Examiner* — Tanisha Diggs
(74) *Attorney, Agent, or Firm* — RatnerPrestia

(57) ABSTRACT

The invention relates to a process for synthesizing poly(3,4-ethylenedioxythiophene)-electrolytic (co)polymer composite in a single step.

6 Claims, 2 Drawing Sheets

Figure 1: size of the particles of the poly(3,4-ethylenedioxythiophene)-(co)-styrene-styrene sulfonate composite latex
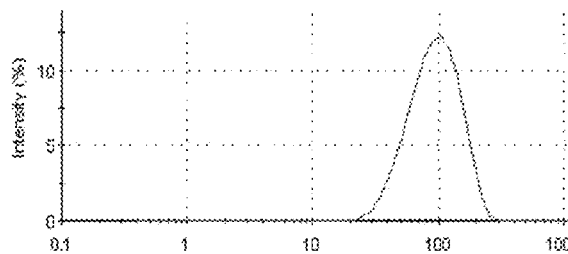
Figure 2: Zeta potential of the poly(3,4-ethylenedioxythiophene)-(co)-styrene-styrene sulfonate composite latex
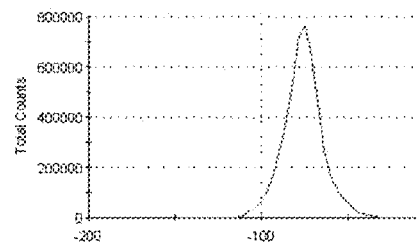

Figure 3:
TEM images at two magnitudes (a and b) of the poly(3,4-ethylenedioxythiophene)-(co)-styrene-styrene sulfonate composite latex
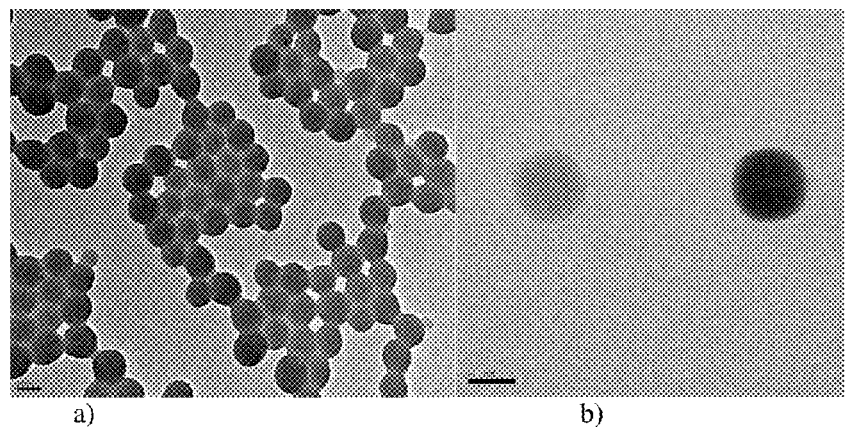
a)          b)
Figure 4: AFM images of the poly(3,4-ethylenedioxythiophene)-(co)-styrene-styrene sulfonate composite latex
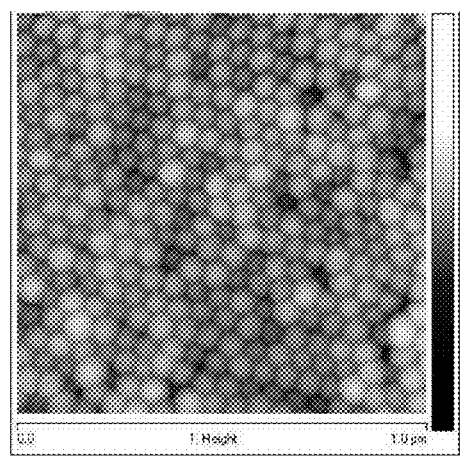

PROCESS FOR SYNTHESIZING PEDOT-ELECTROLYTIC (CO)POLYMER

CROSS-REFERENCE TO RELATED APPLICATIONS

This is the national phase of International Application No. PCT/FR2014/052749, filed 29 Oct. 2014, which claims priority to French Application No. 13.60681, filed 31 Oct. 2013. The disclosure of each of these applications is incorporated herein by reference in its entirety for all purposes.

FIELD OF THE INVENTION

The invention relates to a process for synthesizing poly (3,4-ethylenedioxythiophene)-electrolytic (co)polymer composite in a single step.

DESCRIPTION OF THE RELATED ART

Poly(3,4-ethylenedioxythiophene), known under the abbreviation PEDOT, is a polymer which was discovered in the laboratories of Bayer AG in Germany, in collaboration with the AGFA group, at the end of the 1980s.

It is used in particular in organic electronic applications, especially in photovoltaic cells, but more generally in optoelectronic applications, on account of its good conductivity and in particular on account of its stability to oxidation and its transparency.

It is used together with an electrolytic (co)polymer which is added after synthesis such that the resulting complex forms a donor-acceptor system and is water-soluble. The synthesis of PEDOT takes place generally in the presence of a surfactant, which is occasionally difficult to remove.

The Applicant has discovered that a composite latex of PEDOT-electrolytic (co)polymer may be prepared concomitantly, i.e. in a single step. Besides the simplification of the process, PEDOT-electrolytic (co)polymer is obtained directly, without additional additive such as surfactants, the electrolytic (co)polymer acting as a stabilizer. The latex obtained is also more stable when it is prepared in this way when compared with an addition of electrolytic (co)polymer to pre-prepared PEDOT.

SUMMARY OF THE INVENTION

The present invention relates to a process for the concomitant synthesis of PEDOT and of electrolytic (co)polymer, comprising the following successive steps:
- preparation of a solution of water and of ionic monomer with stirring at a temperature of between 15 and 25° C. in a reactor,
- introduction of a solution of EDOT predissolved in a solvent,
- stirring until dissolved,
- introduction of a solvent-nonionic monomer dispersion,
- stirring until the resulting dispersion has turned white,
- heating to a temperature of between 35 and 55° C.,
- introduction of a solution of initiator and of the remaining EDOT,
- continuation of the stirring and heating in parallel with the continuous or semi-continuous introduction of the solution of the remaining EDOT and of initiator.

It is clearly understood that this process may comprise other preliminary or intermediate steps or steps subsequent to those above.

BRIEF DESCRIPTION OF THE DRAWINGS

FIG. 1: Size of the particles of the poly(3,4-ethylenedioxythiophene)-(co)-styrene-styrene sulfonate composite latex FIG. 2: Zeta potential of the poly(3,4-ethylenedioxythiophene)-(co)-styrene-styrene sulfonate composite latex FIG. 3: TEM images at two magnitudes (a and b) of the poly(3,4-ethylenedioxythiophene)-(co)-styrene-styrene sulfonate composite latex FIG. 4: AFM images of the poly(3,4-ethylenedioxythiophene)-(co)-styrene-styrene sulfonate composite latex.

DETAILED DESCRIPTION

The term "concomitant polymerization of a composite latex of poly(3,4-ethylenedioxythiophene) and of electrolytic (co)polymer" means a polymerization in which the monomers 3,4-ethylenedioxythiophene (EDOT) and the precursor monomers of the electrolytic (co)polymer are simultaneously polymerized using the same initiator.

The term "electrolytic (co)polymer" means any polymer comprising at least one ionic monomer.

It may be any combination of ionic and nonionic monomer.

The ionic monomers may be styrene sulfonate, acrylic acid salts, compounds bearing a phosphonyl imide function or a sulfonyl imide function. Preferably, it is sodium or potassium styrene sulfonate and more preferably it is sodium styrene sulfonate.

The nonionic monomers may be styrene, substituted styrenes or alkyl (meth)acrylates. This monomer is preferably styrene.

The concomitant polymerization of EDOT and of the precursor monomers of the electrolytic (co)polymer is performed in emulsion using a water-soluble initiator. It is preferentially a persulfate and more particularly ammonium persulfate, but any other water-soluble initiator may be used. Ammonium persulfate makes it possible to oxidatively polymerize EDOT to PEDOT and the precursor monomers of the electrolytic (co)polymer into electrolytic (co)polymer via a radical route. The polymerization may be performed in batch, continuous or semi-continuous mode, with or without a preliminary synthesis step of seeding. Preferably, the polymerization is performed semi-continuously. The synthesis temperature is between 35 and 55° C., preferably between 40 and 50° C. and more preferably between 44 and 46° C.

The (3,4-ethylenedioxythiophene)-polyelectrolyte (co)polymer composite latex may be used for dispersing nanofillers such as carbon nanotubes (CNTs), whether they are single-walled or multi-walled, graphenes, fullerenes or a combination of these nanofillers.

The (3,4-ethylenedioxythiophene)-polyelectrolyte (co)polymer composite latex may be used for manufacturing conductive transparent films in the presence or absence of nanofillers. Conductive transparent films may be used in photovoltaic organic cells or in any other optoelectronic application.

EXAMPLE 1

Synthesis of a PEDOT-Polystyrene-Co-Polystyrene Sulfonate Latex

The polymerization reactor is equipped with a jacket for circulating a heat-exchange fluid for heating/cooling the system, a neck for introducing a probe to measure the temperature of the medium, a neck for introducing nitrogen gas to flush out oxygen that is liable to inhibit the polymerization reaction, a stirrer connected to a motor for rotating at variable speed, two necks for adding additives and a neck connected to a condensation/reflux system.

390 mg of styrene sulfonate (1 mol/equivalent) dissolved in 10 ml of demineralized water (concentration 0.04 g/ml) are placed in the reactor. Stirring is set at 450 revolutions per minute (rpm). Via a nitrogen line, the reactor feedstock is degassed for at least 15 minutes until the solution is homogeneous. The reactor then remains under a permanent stream of nitrogen.

In a second stage, the following three mixtures are prepared in suitable containers:
a) a solution made from 0.2 ml (i.e. 266 mg=1 mol/equivalent) of EDOT and 6.6 ml of isopropanol;
b) a dispersion of 0.15 ml (i.e. 137.2 mg=0.6 mol/equivalent) of styrene (St) in 3.4 ml of isopropanol with the aid of an ultrasonic bath;
c) a solution of 1.057 g (i.e. 2.3 mol/equivalent relative to the EDOT and 0.1 mol/equivalent relative to the St+SS) of ammonium persulfate in 26.4 ml of demineralized water (concentration 0.04 g/ml).

The reactor is then stirred at 600 rpm and the first EDOT solution (a) is introduced. The reaction temperature is maintained at 25° C.±2° C. When the reactor components are mixed, the dispersion of styrene monomer (b) is introduced into the reactor. After the reaction medium has turned white (formation of the latex seed), the nominal heating is raised so as to reach a temperature of 45° C. in the reactor. When this temperature is reached, the first quarter of the initiator solution (c) is introduced and the colour of the reaction medium gradually changes to green/blue-green, which indicates the start of polymerization of EDOT. After reaction for 3 hours, metering of the remaining initiator (c) is started continuously, a quarter every 3 hours (three times), using pumps or syringe presses, while maintaining the reactor temperature at 45° C.±2° C.

At the end of the addition, the temperature is maintained at 45° C.±2° C. for a further 2 hours, before cooling and discharging the product. Purification of the final product is performed by ultrafiltration. The filter used is a 100 kilodalton filter. The yield for this reaction steadies at 80%.

The final product was characterized by the following various techniques.

The DLS (dynamic light scattering) technique shows a polydispersity (PDI) of particles of about 0.16 and a volumetric diameter of 80 nm (FIG. 1). The particles are negatively charged and the Z-potential value is equal to −75.8 mV (FIG. 2).

The spherical particles are observed by transmission microscopy (FIG. 3) and AFM (FIG. 4).

EXAMPLE 2

The PEDOT-polystyrene-co-polystyrene sulfonate latex prepared in Example 1 is compared with the commercial latex (PH1000 from the company Clevios).

These products are dispersed in deionized water (1% by mass) and subjected to shear using an IKA T18 Ultra-Turrax machine, at various speeds (15 500, 20 000, 24 000 rpm) for 5 minutes for each speed.

The size of the particles is then measured by DLS. The size of the particles does not change in any of the tests, demonstrating the satisfactory stability of the commercial product or of the product prepared according to the invention.

The invention claimed is:

1. A process for the concomitant synthesis of poly(3,4-ethylenedioxythiophene) and of electrolytic (co)polymer, comprising the following successive steps:
preparing a solution of water and-of ionic monomer with stirring at a temperature of between 15 and 25° C. in a reactor,
introducing a solution of 3,4-ethylenedioxythiophene pre-dissolved in a solvent,
stirring until dissolved,
introducing a solvent-nonionic monomer dispersion,
stirring until the resulting dispersion has turned white,
heating to a temperature of between 35 and 55° C.,
introducing a solution of initiator and the remaining 3,4-ethylenedioxythiophene,
continuing the stirring and heating in parallel with the continuous or semi-continuous introduction of the solution of the remaining 3,4-ethylenedioxythiophene and of initiator.

2. The process as claimed in claim 1, wherein the electrolytic (co)polymer consists of styrene and styrene sulfonate.

3. The process as claimed in claim 1, wherein the electrolytic (co)polymer consists of a salt of acrylic acid and of at least one alkyl (meth)acrylate.

4. The process as claimed in claim 1, wherein the initiator is water-soluble.

5. The process as claimed in claim 1, wherein the initiator is a persulfate.

6. The process as claimed in claim 1, wherein the initiator is ammonium persulfate.

* * * * *